United States Patent [19]

Rennolds

[11] 4,255,390

[45] Mar. 10, 1981

[54] CORRUGATED INTERFACE ZONE REFINER

[75] Inventor: Philip J. Rennolds, Wilmington, Del.

[73] Assignee: E. I. Du Pont de Nemours and Company, Wilmington, Del.

[21] Appl. No.: 57,115

[22] Filed: Jul. 12, 1979

Related U.S. Application Data

[63] Continuation-in-part of Ser. No. 896,431, Apr. 14, 1978, Pat. No. 4,196,042.

[51] Int. Cl.³ ............................................. C30B 35/00
[52] U.S. Cl. .................................................. 422/250
[58] Field of Search ....................... 422/245, 248, 250; 165/151, 182

[56] References Cited

U.S. PATENT DOCUMENTS

| | | | |
|---|---|---|---|
| 1,893,270 | 1/1933 | Caldwell | 165/151 X |
| 2,926,075 | 2/1960 | Pfann | 156/617 |
| 2,949,348 | 8/1960 | Pfann | 156/617 |
| 3,428,437 | 2/1969 | Anderson | 422/250 X |
| 4,133,375 | 1/1979 | Ducasse et al. | 422/245 |

FOREIGN PATENT DOCUMENTS 1136983 9/1962 Fed. Rep. of Germany ...... 156/617 H

OTHER PUBLICATIONS

Zone Melting; Pfann, pp. 78–81, Wiley & Sons (1958).
Apparatus for Zone Melting of Organic Substances, L. Marrelli, Quaderni dell'ingegnero Chimico italiano, 11, 95–99 (1975), No. 6.
Analysis of the Thermal Behavoi of a Pilot Apparatus for Zone Melting of Organic Substances, R. DeSantis, L. Marrelli, and L. Toro, Quaderni dell'ingenero Chimico italiano 11, 100–104 (1975), No. 6.

*Primary Examiner*—William A. Cuchlinski, Jr.

[57] ABSTRACT

The present invention relates to a zone refiner and the process of operating same wherein the freezing interface between the molten zone and the solid zone is corrugated. The use of such a corrugated interface enables one to pass the interface more rapidly along the length of the refiner for a given refining efficiency.

6 Claims, 7 Drawing Figures

$$V = \frac{v}{\sin \theta}$$

CORRUGATED INTERFACE ZONE REFINER

CROSS-REFERENCE TO RELATED APPLICATION

This application is a continuation-in-part of Ser. No. 896,431 filed Apr. 14, 1978, now U.S. Pat. No. 4,196,042.

BACKGROUND OF THE INVENTION

This invention relates to zone refining, sometimes called zone melting, and more specifically to a means for providing an extended interface between the molten zone and the adjacent solid material through the use of extended heat exchange surfaces. Zone refining makes use of the principle that crystallization of a homogeneous liquid mixture results in a solid whose composition is usually different from the composition of the liquid. Zone refining is a fractional solidification process wherein, for example, a molten zone is caused to move slowly through a solid charge from one end to the other for the purpose of purification of a portion of the solid material. Impurities are concentrated ahead of the freezing interface of the molten zone when the operating conditions are properly chosen and when the equilibrium concentration of each impurity is greater in the liquid than in the solid. The process has been widely used for the preparation of ultra-pure materials but it also is useful in the separation of less pure materials. Although several molten zones may be passed through a solid charge simultaneously, the process still suffers from low productivity, especially at higher impurity levels. When a molten zone is moved too rapidly through a solid charge, impurities are not effectively rejected and become trapped in the freezing liquid/solid interface. In general, zone refining devices are operated at a compromise between a good productivity rate and an acceptable rate of entrapment so as to provide the maximum output of material of a given purity per unit time and per unit volume of ingot.

SUMMARY OF THE INVENTION

The present invention relates to a method for zone refining in which the freezing interface between a molten zone and a solid zone is corrugated, i.e., made up of a plurality of generally planar facets which are disposed at an angle to the direction of the movement of the interface along the length of the zone refiner. This use of a corrugated interface at the freezing interface provides for an increase in the area of the interface which provides an increase in the capacity of the unit, and greater thermal efficiency at lower temperature differences. A corrugated interface is not necessary at the melting interface. This method is therefore also useful in normal freezing processes in which there is only a freezing interface. Generally the angle between any facet of the corrugated interface and the axis of the container will be between 5° to about 30°.

The invention also includes means for providing these extended freezing interfaces. For example, a corrugated interface can be formed in a zone-refining apparatus including an elongated sample-holding container which is traversed by one or more tubes for circulating heating and/or cooling fluid to internally heat and/or cool the sample whereby at least one freezing interface is formed and is moved along the container axis, each said tube having at least one thermally conducting fin fixed to it and extending into the sample in the direction of the container axis.

The invention further provides a zone refining apparatus with short heat transfer paths so that overheating of the liquid zones and subcooling of the solid zones is minimized, resulting in high energy efficiency.

The invention further provides for vigorous convective stirring in the melt by arranging for close proximity of the melt to hot and cold surfaces of the extended area of the heat transfer elements.

In one preferred embodiment, the zone refiner contains a plurality of groups of parallel fins, wherein the fins of each group are aligned with each other. The fins are adapted to be heated and cooled by means of tubes in thermal contact with the fins which tubes conduct coolant or heated fluid therethrough. The heating and cooling of the fins is programmed so that the interfaces between molten zones and solid zones of the material being refined are corrugated.

This embodiment provides zone refining apparatus with short heat transfer paths which are independent of equipment size so that full scale production equipment can achieve the same heat fluxes and thus the same performance as laboratory equipment for the same temperature differences.

This embodiment further provides a zone refining apparatus capable of providing a greater reduction in impurities in the product and increased concentration of impurities in the waste with fewer zone passes due to the short heat transfer paths, rapid thermal response, and vigorous convecting stirring. Generally the freezing interface will move along the container axis at a rate of 8 to 50 cm/hour, although higher velocities are possible. The axis may be horizontal or vertical.

In another embodiment, involving a helical zone refiner, a helical fin is provided as part of the helical heater with heat provided by hot fluid passing through the heater, by Joule heating as a result of electrical current passing through the helical fin assembly, or by induction heating of the helical fin.

IN THE DRAWINGS

Figure 1:
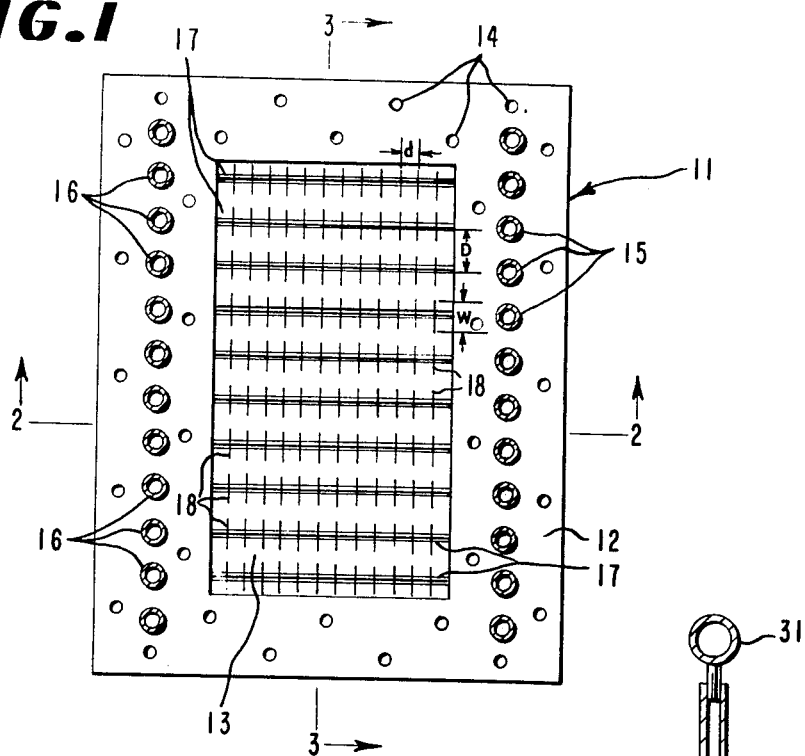
FIG. 1 is a top view of a preferred embodiment of a zone refiner of the present invention.

Referring now to FIG. 1, a zone refiner is indicated generally as 11. Zone refiner 11 is made of a top plate 12 fitted with a plate glass window 13 through which the solid and liquid zones can be observed. Bolts 14 serve to hold top plate 12 to other structural members of zone refiner 11. Pipes 15 and 16 serve to supply heating or cooling fluid to pipes 17 to heat or cool vertical fins 18.

Figure 2:
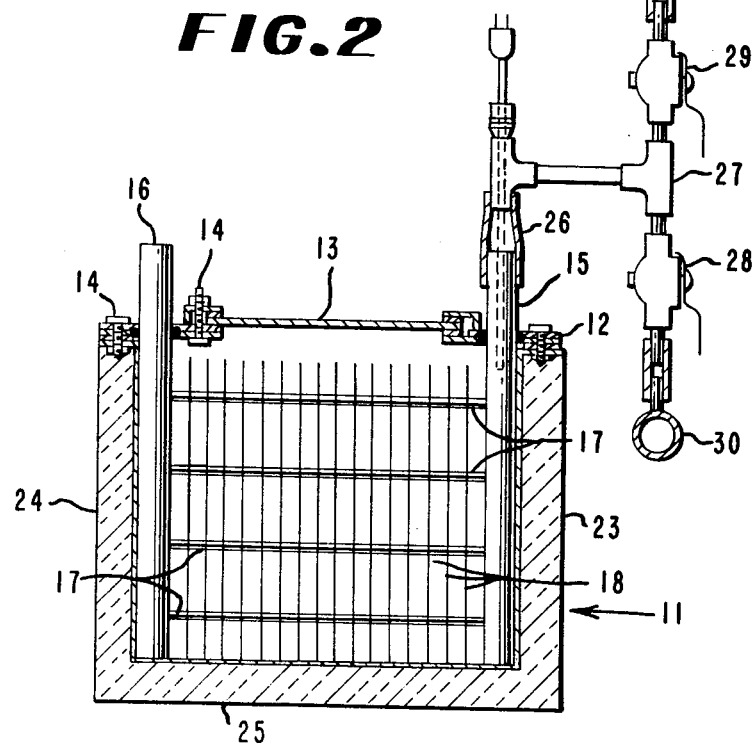
FIG. 2 is a cross-section taken on line 2—2 of FIG. 1 and shows heating and cooling fluid connections on one side.

Referring now to FIG. 2, a cross-section taken on line 2—2 of FIG. 1, pipes 15 and 16 are shown connected to heat exchanger tubes 17 passing through and making contact with vertical fins 18. Zone refiner 11 has thermally insulating, vertical sides 23 and 24 and bottom 25. Pipe 15 is fitted with a thermocouple 26 for measuring the temperature of the heating or cooling fluid being used in zone refiner 11. Pipe 15 is connected to a tee 27 which in turn connects to valves 28 and 29. Valve 28 is connected to main supply 30 which contains hot fluid. Valve 29 is connected to main supply 31 which contains cold fluid. Pipe 16 is similarly fitted with a thermocouple, tee, valves and main returns for hot and cold fluid.

Figure 3:
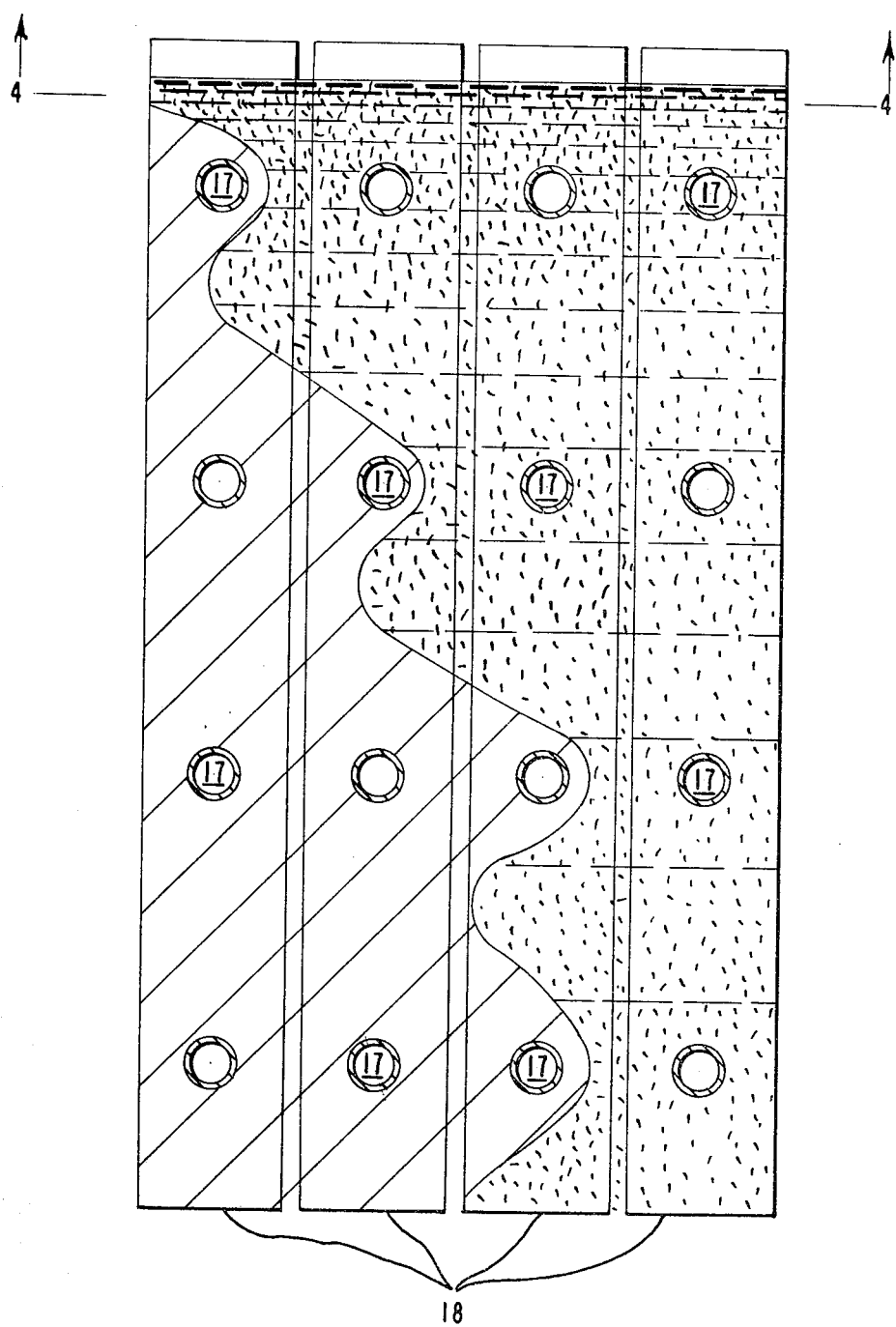
FIG. 3 is an enlarged partial cross-section taken on line 3—3 of FIG. 1.

Referring now to FIG. 3, which is an enlarged partial cross-section taken on line 3—3 of FIG. 1, heat exchanger tubes 17 are shown fitted with vertical fins 18. As can be seen a solid zone is being formed behind a molten zone which is advancing from left to right across FIG. 3.

This figure shows a heat transfer assembly or element (HTE) which consists of an inlet pipe 15, an outlet pipe 16, four heat exchange tubes 17, and sixteen vertical fins 18.

Figure 4:
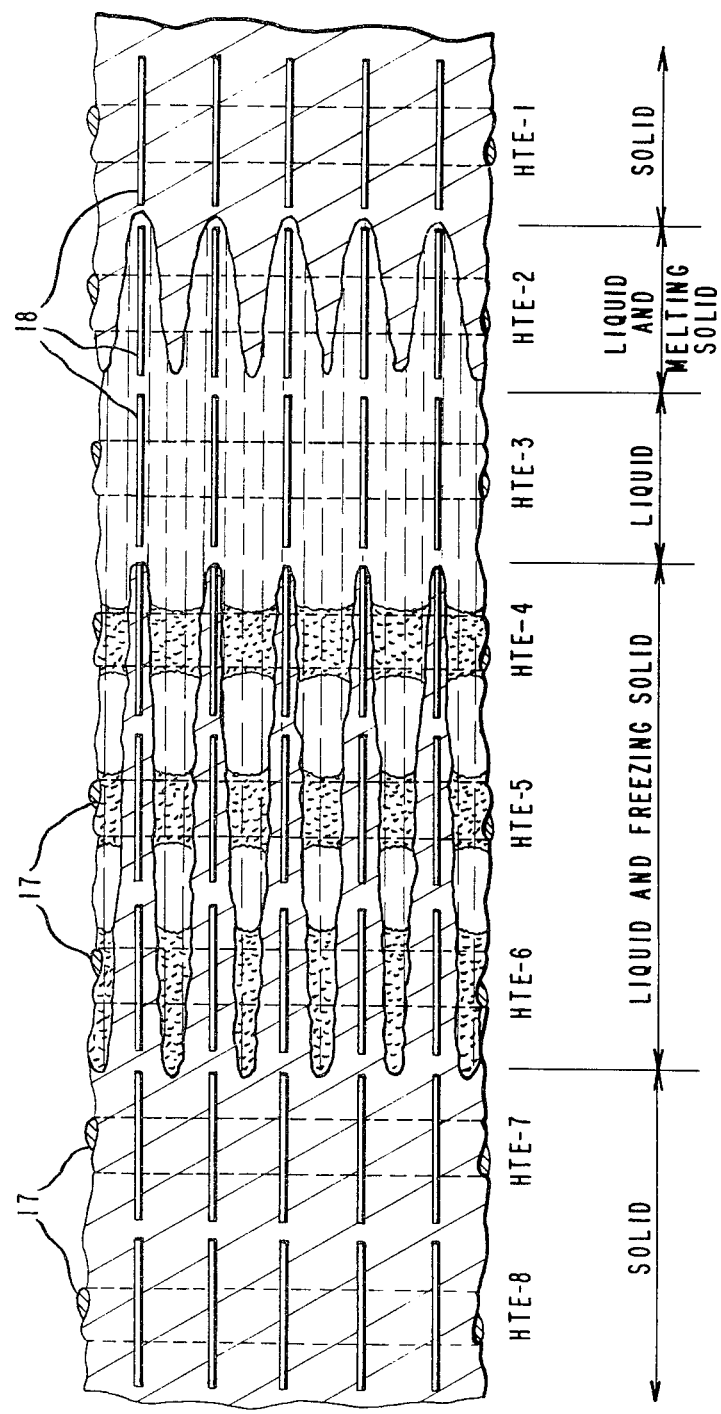
FIG. 4 is a top view of a cross-section taken on line 4—4 of FIG. 3 and shows an advancing corrugated interface.

FIG. 4 is a partial top view of a cross-section taken on line 4—4 of FIG. 3 and schematically shows a molten zone of liquid being passed from left to right. Consider the fluid passing through the heat-transfer element (HTE), HTE-2, to have just been switched from coolant to hot fluid and that through HTE-4 from hot fluid to coolant. The solid on the extreme right is being maintained solid by coolant passing through HTE-1. The heat applied to HTE-2 is advancing the liquid zone to the right and the liquid formed mixes with the liquid adjacent to HTE-3. The heating of HTE-3 results in convective stirring of the liquid growing onto the freezing corrugated interface. Cooling applied to HTE-4 results in growth of the freezing corrugated interface which has been forming HTE-5 and HTE-6 as a result of an earlier introductory coolant to these HTE's. Coolant through HTE-7 and HTE-8 maintain the mixture at the extreme left solid. Normally a plurality of molten and solid zones will be present within the zone refiner.

While the method of separation just described involves the passing of a molten zone through a solid sample, the method is equally effective in passing a solid zone through a liquid sample. In usual operations when there are several zones of each type present, motion can be described in terms of either liquid or solid zones. It is the extended or corrugated freezing interface which provides the advantages of this invention and it is the motion of this interface which is relevant.

Figure 5:
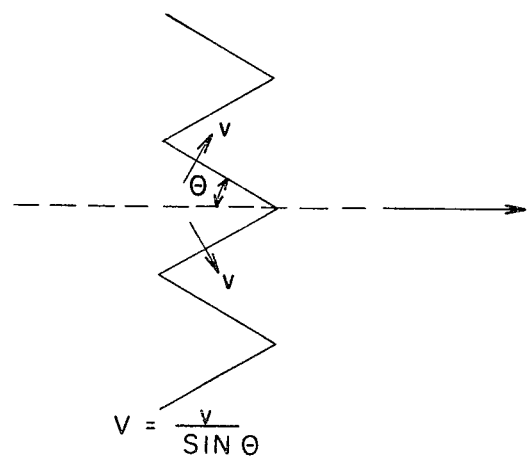
FIG. 5 is a schematic view showing an advancing corrugated interface.

Higher interface pass velocities can be obtained using the corrugated interface zone refiner of the present invention as compared to a conventional zone refiner having a planar interface between the molten and solid zones. As a result of the short heat transfer paths, rapid thermal response, and vigorous convective stirring which results with the corrugated interface, solidification or melting velocities v are higher than those attainable with a planar interface. In addition, for a given solidification or melting velocity v, an even larger effective zone pass velocity V is obtained for the corrugated interface as a result of the geometrical effect illustrated in FIG. 5. The relationship is $V = v/\sin\theta$ where $\theta$ is the angle between any facet of the corrugation and the container axis. For illustrative purposes, each facet is depicted as planar. In practice, the facets will deviate somewhat from planarity because the fins have finite widths which result in a "stepped" corrugated interface as shown in FIG. 4. The facets can still be approximated as planar, and the angle $\theta$ is then taken as the angle between the planar approximation of the facet and the container axis. In order to take advantage of the various beneficial effects of the corrugated interface it is desirable that $\theta$ be between about 5° and about 30°. This angle is determined by the design of the apparatus, e.g., the distance between fins and the dimensions of fins, and by the number of heat transfer elements involved in forming the corrugation as a result of the particular switching pattern used. As a specific example of the increase in effective velocity, when $\theta = 10°$, $V = 6$ v.

In a variation of the above embodiment, the heat transfer element consists of a series of fins which are flattened hollow tubes connected directly to the inlet and outlet pipes and which extend into the sample in planes parallel to the container axis.

When the apparatus axis is vertical, more effective convective stirring can be achieved if the planes of the fins are tilted slightly from the vertical—that is if the planes of the fins makes an angle of up to about 15° with the vertical. The corrugated interface will be correspondingly skewed.

Figure 6:
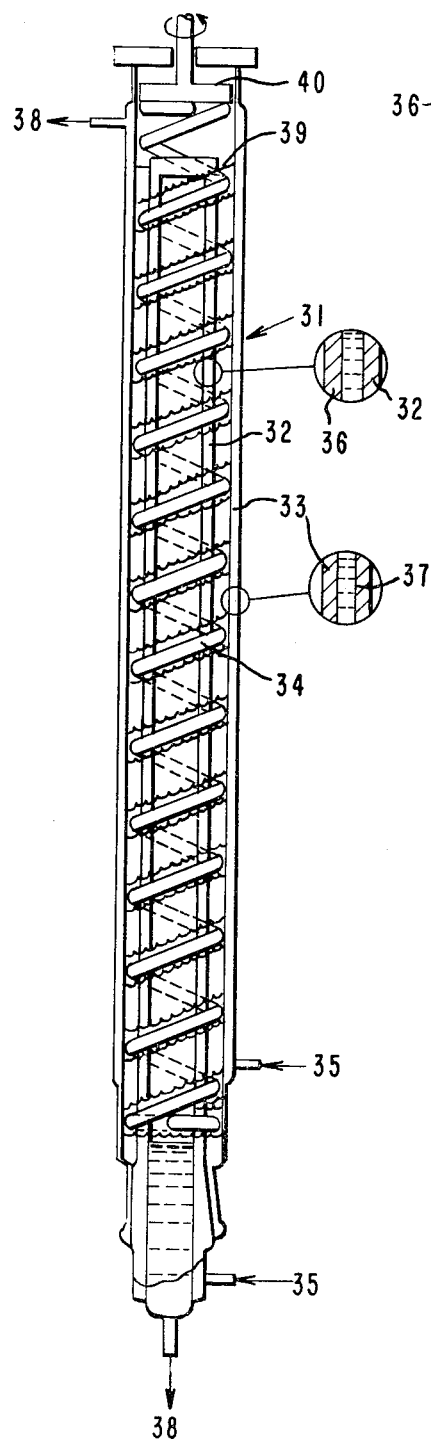
FIG. 6 is a cross-sectional view of a helical zone refiner.
Figure 7:
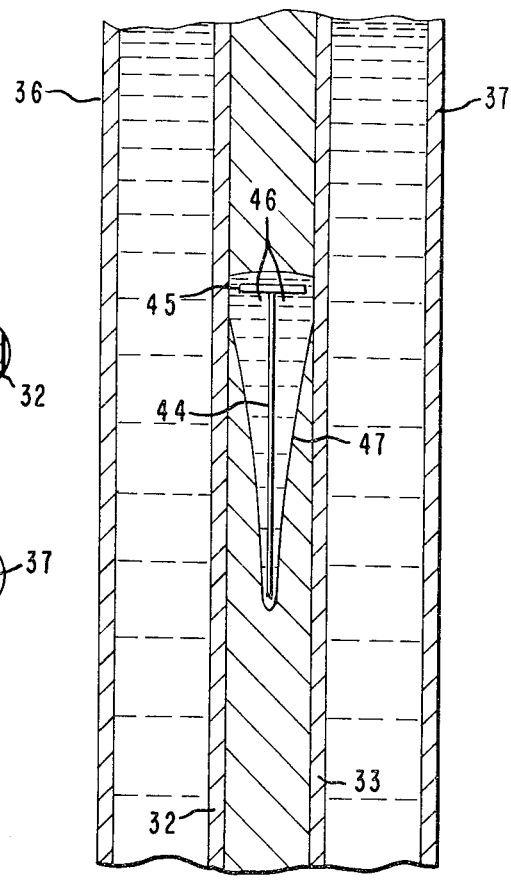
FIG. 7 is an enlarged partial cross-section showing a design for the finned helical heater.

FIG. 6 shows a cross-section of a helical zone refiner 31. The sample is contained in the annular region between two concentric jacketed cylinders, i.e., the normally solid sample is contained between the outer wall 32 of the inner cylinder and the inner wall 33 of the outer cylinder. A helical heater 34 contains hot fluid or is heated by electrical (Joule) heating and as shown is surrounded by a helical molten zone in an otherwise solid sample, the top of which is at 39. Coolant enters through tubes 35, flows through the inner and outer cylindrical jackets, i.e., between the walls 32 and 36 to cool the inner sample-containing wall 32 and between the walls 33 and 37 to cool the outer sample-containing wall 33, and leaves through tubes 38. The helical heater 34 is clamped to the rotating disc 40. Operating conditions are controlled so that as the helical heater rotates slowly, the helical molten zone rotates with it. For the direction of motion shown, the heating motion is downward to move the freezing interface and the rejected impurities downward. FIG. 7 is an enlarged cross-section showing details of one kind of helical finned heating tube. The walls 32 and 33 contain the normally solid sample. Liquid coolant is contained between walls 32 and 36 of the inner jacket cylinder and walls 33 and 37 of the outer jacket cylinder. In the embodiment shown the fin 44 which creates the corrugated surface trails the horizontal fins 45, i.e., heating motion is effectively upward as the helical heater rotates around the annulus. This embodiment also uses Joule heating by means of electrical current passing directly through the fins or the fins and insulated copper wires 46. Alternatively hot fluid could be passed through a pipe relacing the horizontal fin. The freezing interface 47 moving upward forms a curved one-corrugation interface with area considerably larger than that associated with a flat annulus. The heating by the vertical fin provides the vigorous convective stirring of the melt.

The two types of extended interfaces that have been shown in some detail are corrugated in the usual sense of alternate grooves and ridges. However, this invention is not limited to such extended interfaces, but rather embraces equivalent interfaces which are apparent to one skilled in the art. For brevity we refer to all of these interfaces as corrugated. Included is an interface with grooves and ridges in two orthogonal directions as would be obtained using an orthogonal honeycomb array of heat transfer elements with the resulting interface consisting of an array of pyramidal forms with the angle that the container axis makes with the planes of the pyramidal faces being between about 5° and 30°. Instead of pyramidal forms, the interface could be made up of an array of circular conical forms.

These methods for purification are applicable to a broad spectrum of materials—melts, molten mixtures, and solutions such as KH$_2$PO$_4$—KCl—H$_2$O in which all these are present in the liquid but only KH$_2$PO$_4$ and KCl are present in the solid.

DESCRIPTION OF THE PREFERRED EMBODIMENTS

The zone refiner depicted in FIGS. 1-4 is used in Examples 1 and 2. The twelve heating and/or cooling assemblies (heat transfer elements) each comprising an inlet pipe 15, an outlet pipe 16, four heat exchanger tubes 17 and 15 vertical fins 18, are referred to as HTE-1 through HTE-12. The inlet and outlet pipes are ⅝ inch (1.59 cm) copper tube (¾ inch (1.91 cm) OD) and the heat exchanger tubes are ⅛ inch (0.25 inch, 0.64 cm) copper tube (⅜ inch (0.95 cm) OD)×1/32 inch (0.08 cm) wall thickness. The copper fins measure 1 inch (2.54 cm) by 8 inches (20.32 cm) by 1/32 inch (0.08 cm) thick. The fins of each assembly are spaced ½ inch (1.2 cm) apart. The ingot measures 8 inches (20.32 cm) high, 8½ inches (21.59 cm) wide and 13½ inches (34.29 cm) long. There is a 2⅛ inch (5.4 cm) clearance between the top of the ingot container. The 12 HTE's are 1⅛ inch (2.86 cm) center distances apart. The hot fluid supply line 30 is connected to a pump circulating glycol/water over a thermostatically controlled 100-watt heater set at appropriate temperatures to which return pipes 16 can be connected. Cold fluid supply pipe 31 is connected to a glycol/water bath maintained at the desired temperature by a refrigeration unit. Thermocouples may be introduced at various positions to maintain temperatures in the sample and in the heating and cooling fluids.

In designing a zone melting apparatus to provide a corrugated interface, limitations are imposed by the conditions necessary to produce the interface as well as by practical considerations. Depending on the size of the container and the number of heat transfer elements (HTE) present, one, two, three, four or more HTE's can be used to form a corrugated interface. For example, in FIG. 4 the freezing interface extends over three HTE's, HTE-4, HTE-5, and HTE-6. The angle a facet of the corrugated interface makes with the container axis is to be between about 5° and about 30°. Therefore, if the corrugated interface extends over one, two, three or four HTE's, the ratio of the center distance D between adjacent HTE's and the distance d between adjacent fins 18 of a given HTE is between about 1 and about 6. In order to produce a corrugated interface which extends over more than one HTE and to have high energy efficiency, the fins must extend into the sample in the direction of the container axis, i.e., the direction of motion of the interface, a sufficient amount in order to provide the short heat transfer paths necessary. This fin 18 dimension W which determines the extent of extension into the sample is shown in FIG. 1 and must be greater than ¼ D. To be consistent with the aims of this invention D is between about ¾" (1.91 cm) and about 6" (15.2 cm) and d is between about ¼" (0.635 cm) and about 1" (2.54 cm). In preferred embodiments, W is between about ⅜ D and about 11/12 D, the ratio of D to d is between about 1 and 3, D is between about ¾" (1.91 cm) and 2" (5.08 cm) and d is between about ¼" (0.635 cm) and about ¾" (1.91 cm). The outer diameter of a heat transfer tube 17 is less than ½ D.

The helical zone refiner shown in FIGS. 6 7 has inner 32 and outer 33 annular dimensions of 2 inches (5.08 cm) and 2½ inches (6.35 cm) respectively. The pitch of the heater is 2 inches (5.08 cm) and the overall length of the refiner is 30 inches (76 cm).

All the Examples were carried out using the zone refiner shown in FIGS. 1-4.

EXAMPLE 1—NORMAL FREEZING

The purpose of these runs is to demonstrate the advantage of the corrugated interface in normal freezing and to demonstrate some aspects of the corrugated interface—both static and moving.

The sample container was loaded with 30.0 lbs (13.6 Kg) of a mixture of 95% by weight of benzene and 5% cyclohexane. A normal freezing run was started in which all heating was done by hot fluid in HTE-1 and cooling fluid was turned on in succession in HTE-12, HTE-11, etc. to freeze from the back to the front of the container. This arrangement was chosen to provide effective convective stirring of bulk liquid. The normal freezing run is started with both HTE-12 and HTE-11 frozen. Both stood overnight with the fluid flows as reported for 09:30. Table I which shows the operation of the zone refiner, i.e. the switching of fluid as a function of time, and some monitored temperatures. The sample thermocouple in HTE-5 is 2 inches (5.08 cm) from the bottom. The sample thermocouple in HTE-6 is 5 inches (12.7 cm) from the bottom. The sample thermocouples in HTE-7, 8 and 9 are 6 inches (15.24 cm) from the bottom. The interface movement is started by switching HTE-10 from off to cold and every 20 minutes switching the next HTE in turn from off to cold reported in Table I until HTE-4 is switched to cold at 12:20-½. This results in a corrugated interface moving at 8.57 cm/hr. Twenty minutes after the last switch the remaining melt is sucked out of the sample container over the next three minutes to end the normal freezing.

To start unloading the solid, hot fluid is passed through HTE-4. The material adjacent to the fins melted and ran down into the space left empty from sucking out the melt at 12:40-12:43. This leaves an air gap between the solid remaining between the fins and the fins. Subsequent melting is slow. In allowing time for this solid between the fins to melt, the melt in the bottom of the container heats and melts the solid at the bottom of HTE-5, then at the bottom of HTE-6 etc. despite the cold fluid circulating through these HTE's (−20° C. coming in and −19° C. going out). The hot fluid to HTE-4 is coming in at +65° C. and leaving at +64° C. In subsequent meltings of HTE-5, HTE-6, etc., the melt is sucked off as fast as it forms to avoid this problem.

The data on cut sizes and compositions is reported in Table II. The expected cut size is 1082 g. Instead of solid on the partially frozen HTE-4 at shut down being less than this it is considerably more, 1893 g, showing that the undercutting of the adjacent HTE sections as described above is considerable. For example, HTE-5 weighs only 586 g or a little more than half of the expected value if completely filled with solid at shutdown.

The solid on HTE-7 through HTE-12 is left frozen over the weekend. The thermostat in the refrigeration unit is set at −12°. On Monday morning the bath is at −6° C. and there is liquid in the bottom of the sample container, 208.5 g including 20 g of water. This is entrapped mother liquor that has drained out of the solid. It analyzes the highest of any sample in cyclohexane, namely 13.7% cyclohexane corresponding to −2° C. on the phase diagram.

posited into one large cut. As a result of the undercutting event, the analytical data to show that the $(k_a)_{average}$ is much poorer at the bottom of the corrugated interface. The 1893 gms. of cut HTE-4 included the solid on HTE-4 plus an estimated 1400 gms. of undercut solid

TABLE I

HTE - FLUID FLOW & SAMPLE TEMPERATURES

| TIME | 1 | 2 | 3 | 4 | 5 | 6 | 7 | 8 | 9 | 10 | 11 | 12 |
|---|---|---|---|---|---|---|---|---|---|---|---|---|
| 09:30 | Hot | Off | Off | Off | Off | Off | Off | Off | Off | Off | Cold | Cold |
| 10:20¼ | Hot | Off | Off | Off | +10° C. Off | +13° C. Off | +13° C. Off | +13° C. Off | +13° C. Off | Off ↓ Cold | Cold | Cold |
| 10:37 |   |   |   |   | +5¼° C. | +8¼° C. | +8¼° C. | +8¼° C. | +8¼° C. |   |   |   |
| 10:40 | Hot | Off | Off | Off | Off | Off | Off | Off | Off ↓ Cold | Cold | Cold | Cold |
| 10:59 |   |   |   |   | +4° C. | +6¼° C. | +6¼° C. | +6¼° C. | +6¼° C. |   |   |   |
| 11:00 | Hot | Off | Off | Off | Off | Off | Off | Off ↓ Cold | Off | Cold | Cold | Cold |
| 11:19¼ |   |   |   |   | +4° C. | +6¼° C. | +6¼° C. | +6¼° C. | −1 |   |   |   |
| 11:20¼ | Hot | Off | Off | Off | Off | Off | Off ↓ Cold | Cold | Cold | Cold | Cold | Cold |
| 11:39 |   |   |   |   | +3¼° C. | +6¼° C. | +6¼° C. | +3° C. | −2° C. |   |   |   |
| 11:40 | Hot | Off | Off | Off | Off | Off ↓ Cold | Cold | Cold | Cold | Cold | Cold ↓ Off | Cold ↓ Off |
| 11:58 |   |   |   |   | +3¼° C. | +6¼° C. | +4¼° C. | −15° C. | −21¼° C. |   |   |   |
| 12:00 | Hot | Off | Off | Off | Off ↓ Cold | Cold | Cold | Cold | Cold | Cold ↓ Off | Off | Off |
| 12:18¼ |   |   |   |   | −7° C. | +3° C. | −16° C. | −20¼° C. | −21° C. |   |   |   |
| 12:20¼ | Hot | Off | Off | Off | Cold ↓ Cold | Cold | Cold | Cold | Cold ↓ Off | Off | Off | Off |
| 12:40 | STARTED SUCKING MELTED PORTION OF SAMPLE OUT. |
| 12:43 | FINISHED SUCKING MELTED PORTION OF SAMPLE OUT. |

TEMPERATURE °C.

| TIME | Glycol Water Bath °C. | Hot Manifold In | Hot Manifold Out | Cold Manifold In | Cold Manifold Out |
|---|---|---|---|---|---|
| 09:30 10:20¼ | −28 | +29 | +27 | −27½ | −27 |
| 10:37 10:40 | −26 | +28½ | +26 | −25½ | −24 |
| 10:59 11:00 | −26 | +26½ | +24½ | −26 | −25 |
| 11:19¼ 11:20¼ | −25 | +27 | +24½ | −25½ | −24½ |
| 11:39 11:40 | −23½ | +26½ | +24½ | −23½ | −21½ |
| 11:58 12:00 | −22½ | +26½ | +24 | −22½ | −22 |
| 12:18¼ 12:20¼ 12:40 12:43 | −22½ | +26 | +23½ | −22 | −21 |

The unexpected undercutting and drainage had to be taken into consideration in calculating values of the separation constant $(k_a)$ average. The undercutting and drainage are considered not to have affected significantly the cuts of HTE-10, HTE-11, and HTE-12 and accordingly the $(k_a)$ average was calculated straightforward as $$(k_a)_{average} = \frac{\text{Solid analysis for cyclohexane}}{\text{Melt analysis for cyclohexane}}$$

Cuts HTE-1 through HTE-3 are lumped together as the liquid removed at the end of the last switching period. For cuts HTE-4 through HTE-9 the results were compared from HTE-5 through HTE-9. This 7.62% cyclohexane measured for this cut can be compared with 3.01% cyclohexane content found for the 3711 gm that comprised the solid in the upper part of HTE-5 through HTE-9. This shows that the lower part of the corrugated interface was much higher in solute concentration that the upper part. In fact, the 7.62% measured for cut HTE-4 material is well above the bulk liquid average concentration of 7.01%, and would give a $(k_a)_{average}$ greater than 1. Therefore, the 7.62% solid did indeed freeze from a liquid that was locally significantly higher than the bulk liquid as indicated by the low temperature observed in the temperature surveys at the bottom of the liquid.

The results for the $(k_a)_{average}$ values show that separation was achieved. Separation constants for the cuts HTE-12, HTE-11, and HTE-10 which were included in the start-up freeze and represent ⅓ of the initial sample were 0.17, 0.22, and 0.28. Separation constants for the steady state solid (cuts HTE-9 through HTE-4) average to 0.65.

TABLE II

| HTE No. | Weight g | Analysis of Solid Cyclohexane (%) | |
|---|---|---|---|
| 1 } | 3463 | 7.39 | |
| 2 } | | | |
| 3 } | | | |
| 4 | 1893 | 7.62 } | |
| 5 | 586 | 4.00 } | |
| 6 | 777 | 4.32 } | |
| drain | 189 | 13.70 } | 4.57 |
| 7 | 635 | 1.37 } | |
| 8 | 734 | 1.23 } | |
| 9 | 790 | 1.41 } | |
| 10 | 1039 | 1.69 | |
| 11 | 1176 | 1.30 | |
| 12 | 1424 | 0.84 | |

| HTE No. | Analysis of Melt Cyclohexane (%) | | $(K_a)_{average}$ | |
|---|---|---|---|---|
| 1 | | | | |
| 2 | | | | |
| 3 | | | | |
| 4 | 7.74 } | | } | |
| 5 | 7.47 } | | } | |
| 6 | 7.32 } | | } | |
| drain | } | 7.01 | } | .65 |
| 7 | 6.82 } | | } | |
| 8 | 6.47 } | | } | |
| 9 | 6.24 } | | } | |
| 10 | 6.05 | | 0.28 | |
| 11 | 5.78 | | 0.22 | |
| 12 | 5.00 | | 0.17 | |

Additional information was obtained from vertical temperature gradients measured in static and moving corrugated interface. In the static interface (with HTE-1, hot, HTE-2 through HTE-11 off, and HTE-cold) temperature was measured at various depths at several HTE's. The top of the sample was found to be from 6° to 16° C. hotter than the bottom of the sample. This appears to indicate that there is overall rotation of the bulk liquid up from the bottom to the top of the hot HTE across the top and down from top to bottom at the cold HTE to return across the bottom to the hot HTE. Similarly, in the corrugated interface moving at a velocity of 8.56 cm/hr the temperature of the liquid leaving at the bottom of the cold HTE was very low, namely −12.3° C. A liquid at this temperature would have to be at a cyclohexane concentration approaching 33% cyclohexane. This is a large local build-up of rejected cyclohexane from 5.78% cyclohexane in the bulk liquid entering the corrugations at the top to 33% leaving at the bottom. This build-up occurred in HTE-9 ten minutes after the fluid was switched from hot to cold and 10 minutes before solid formed in this region. This suggests that an improvement in mixing would be obtained by making the container axis vertical rather than horizontal as in the demonstration unit described herein.

EXAMPLE II

The zone refiner used in Example I is charged with 29.7 lbs (13.5 Kg) of a solution of 1 wt. % cyclohexane and 99 wt. benzene. Several combinations of hot HTE's and cold HTE's are tried before settling on 2 hot HTE's and 5 cold HTE's as the pitch length with switching every 20 minutes for a corrugated spike tip speed of 8.57 cm/hr with zoning proceeding from back of the zone refiner to front. The hot fluid is held at +18° C. and the cold fluid at −15° C. to −16° C. The switching operation for pass 4 is reported in Table III. This pass is typical of the eleven passes made. It is necessary to stop the switching overnight since it is done by hand. Overnight the hot and cold fluid are circulated as they are after the last switch. The next morning switching was started again with 20 minutes intervals on the first day and the eleven passes were completed.

Melt samples were taken from the top of each molten zone as it was formed and started being passed through the sample from back to front. The analysis for cyclohexane in HTE-12 immediately after HTE-12 was switched from hot to cold on each pass is reported in Table IV.

TABLE III

HTE - FLUID FLOW & SAMPLE TEMPERATURES °C.

| TIME | 1 | 2 | 3 | 4 | 5 | 6 | 7 | 8 | 9 | 10 | 11 | 12 |
|---|---|---|---|---|---|---|---|---|---|---|---|---|
| 0.9:00 | | | | | +10 | +11 | +11 | −6 | −16 | | | |
| 09:03 | C | C | C | C→H | H | H→C | C | C | C | C | C→H | H |
| 09:20 | | | | | +7 | +8 | +5 | −4 | −6½ | | | |
| 09:23 | C | C | C→H | H | H→C | C | C | C | C | C→H | H | H→C |
| 09:40 | | | | | −3½ | +3½ | −13 | −15 | −11 | | | |
| 09:43 | C | C→H | H | H→C | C | C | C | C | C→H | H | H→C | C |
| 10:00 | | | | | −13 | −12 | −14½ | −11 | +5 | | | |
| 10:03 | C→H | H | H→C | C | C | C | C | C→H | H | H→C | C | C |
| 10:19 | | | | | −14½ | −14½ | −11½ | +7 | +9 | | | |
| 10:23 | H | H→C | C | C | C | C | C→H | H | H→C | C | C | C |
| 10:40 | | | | | −14 | −10 | +7 | +9½ | +9 | | | |
| 10:43 | H→C | C | C | C | C | C→H | H | H→C | C | C | C | C |
| 11:00 | | | | | −11 | +4½ | +9 | +7½ | +6 | | | |
| 11:03 | C | C | C | C | C→H | H | H→C | C | C | C | C | C→H |
| 11:20 | | | | | +7 | +6½ | +7½ | +0 | −11 | | | |
| 11:23 | C | C | C | C→H | H | H→C | C | C | C | C | C→H | H |
| 11:43 | | | | | +8 | +8 | −12 | −15 | −15 | | | |
| 11:47 | C | C | C→H | H | H→C | C | C | C | C | C→H | H | H→C |
| 12:07 | | | | | −5 | −5 | −14 | −15 | −12 | | | |
| 12:08 | C | C→H | H | H→C | C | C | C | C | C→H | H | H→C | C |
| 12:30 | | | | | −16 | −15 | −16 | −16 | +4 | | | |
| 12:34 | C→H | H | H→C | C | C | C | C | C→H | H | H→C | C | C |
| 12:48 | | | | | −14 | −14 | −12 | +4½ | +8 | | | |
| 12:51 | H | H→C | C | C | C | C | C→H | H | H→C | C | C | C |
| 13:07 | | | | | −12½ | −8½ | +9½ | +9½ | +9½ | | | |

TABLE III-continued

HTE - FLUID FLOW & SAMPLE TEMPERATURES °C.

| 13:11<br>13:27 | H→C | C | C | C | C<br>−9 | C→H<br>+4 | H<br>+9 | H→C<br>+9 | C<br>+7 | C | C | C |
|---|---|---|---|---|---|---|---|---|---|---|---|---|

| | | TEMPERATURE °C. | | | |
|---|---|---|---|---|---|
| | Glycol<br>Water | Hot Manifold | | Cold Manifold | |
| TIME | Bath | In | Out | In | Out |
| 09:00 | −18½ | +19 | +18 | −18 | −17½ |
| 09:03 | | | | | |
| 09:20 | −18½ | +18½ | +18 | −18 | −17½ |
| 09:23 | | | | | |
| 09:40 | −18½ | +18½ | +18 | −17 | −15½ |
| 09:43 | | | | | |
| 10:00 | −17½ | +18½ | +18 | −16 | −15½ |
| 10:03 | | | | | |
| 10:19 | −16½ | +19 | +18 | −16 | −15½ |
| 10:23 | | | | | |
| 10:40 | −16 | +18½ | +18 | −15½ | −15 |
| 10:43 | | | | | |
| 11:00 | −16 | +18½ | +18 | −15 | −15 |
| 11:03 | | | | | |
| 11:20 | −16½ | +14½ | +14½ | −16½ | −15½ |
| 11:23 | | | | | |
| 11:43 | −17 | +18 | +18½ | −17 | −16 |
| 11:47 | | | | | |
| 12:07 | −17 | +18 | +18 | −17 | −16 |
| 12:08 | | | | | |
| 12:30 | −15 | +18½ | +18 | −15 | −15½ |
| 12:34 | | | | | |
| 12:48 | −15 | +19 | +18 | −15 | −14½ |
| 12:51 | | | | | |
| 13:07 | −14½ | +18½ | +18 | −16 | −15½ |
| 13:11 | | | | | |
| 13:27 | −14 | +18 | +18 | −14 | −13 |

TABLE IV

| Pass | Cyclohexane<br>wt. % |
|---|---|
| 2 | 0.73 |
| 3 | 0.55 |
| 4 | 0.40 |
| 5 | 0.26 |
| 6 | 0.19 |
| 7 | 0.16 |
| 8 | |
| 9 | 0.11 |
| 10 | |
| 11 | 0.08 |

The cyclohexane content of HTE-12 decreased by more than a factor of 12 from its initial value after eleven passes.

In order to analyze the final product, cuts were melted as described in Example 1. By sucking out the melt as it forms no problems are encountered taking the cuts.

The analysis for cyclohexane in each of the HTE sections after the eleventh pass is reported in Table V.

TABLE V

| HTE<br>No | Weight<br>g | Cyclohexane<br>wt. % |
|---|---|---|
| 1 | 891 | 3.204 |
| 2 | 1381 | 2.032 |
| 3 | 773 | 1.615 |
| 4 | 1084 | 1.249 |
| 5 | 1549 | 0.896 |
| 6 | 955 | 0.720 |
| 7 | 1399 | 0.437 |
| 8 | 1295 | 0.531 |
| 9 | 1123 | 0.384 |
| 10 | 1077 | 0.289 |
| 11 | 1327 | 0.206 |

TABLE V-continued

| HTE<br>No | Weight<br>g | Cyclohexane<br>wt. % |
|---|---|---|
| 12 | 1021 | 0.074 |

This shows a 43 fold spread in cyclohexane concentration between the clean and dirty ends of the ingot, 0.074% and 3.204% respectively.

I claim:

1. A zone melting apparatus comprising an elongated sample-holding container which is traversed by a series of heat transfer elements each comprised of one or more heat transfer tubes to internally heat and/or cool the sample contained in said container, said elements having a plurality of thermally conducting fins spaced regularly at fixed positions along the tubes of the elements and extending into the sample in planes parallel to the container axis, and means to regulate the flow of hot or cold fluid through each of the various heat transfer elements thereby producing at least one molten zone bounded on opposite sides by solid material with a corrugated freezing interface therebetween and means to switch the fluids through each heat transfer element from hot to cold and cold to hot in order to successively heat and cool different portions of the sample thereby moving the molten zone and the corrugated freezing interface along the axis through the sample, in which the ratio of the center distance D between adjacent heat transfer elements and the distance d between adjacent fins of a given element is between about 1 and about 6 and the fin dimension W parallel to the axis of the container is greater than ¾ D.

2. The zone melting apparatus of claim 1 in which the outer diameter of the heat transfer tubes is less than about ½ D.

3. The zone melting apparatus of claim 2 in which the distance D between tubes is between about ¾" (1.91 cm) and 6" (15.2 cm) and the distance d between fins is between about ¼" (0.635 cm) and 1" (2.54 cm).

4. The zone melting apparatus of claim 3 in which the fin dimension W is between ¾ D and 11/12 D.

5. The zone melting apparatus of claim 4 in which the ratio of D to d is between about 1 and 3 and D is between about ¾" (1.91 cm) and about 2" (5.08 cm) and d is between about ¼" (0.635 cm) and about ¾" (9.91 cm).

6. The zone melting apparatus of claim 5 in which D is about 1⅛" (2.86 cm), d is about ½" (1.27 cm), W is about 1" (2.54 cm) and the outer diameter of the heat transfer tubes is ⅜" (0.95 cm).

* * * * *

UNITED STATES PATENT AND TRADEMARK OFFICE
CERTIFICATE OF CORRECTION

PATENT NO. : 4,255,390
DATED : March 10, 1981
INVENTOR(S) : Philip J. Rennolds

It is certified that error appears in the above—identified patent and that said Letters Patent is hereby corrected as shown below:

Column 5, line 22, "1/2" should read -- 1/4 --. Column 6, line 25, "fun" should read -- run --. Column 10, Table III, in the TIME column, "0.9:00" should read -- 09:00 --. Column 14, line 6, "2/3" should read -- 1/2 --.

Signed and Sealed this

Twenty-fourth Day of November 1981

[SEAL]

Attest:

GERALD J. MOSSINGHOFF

Attesting Officer

Commissioner of Patents and Trademarks